(12) United States Patent
Leobandung

(10) Patent No.: US 10,784,169 B2
(45) Date of Patent: Sep. 22, 2020

(54) SELF-ALIGNED HARD MASK FOR EPITAXY PROTECTION

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/786,872

(22) Filed: Oct. 18, 2017

(65) Prior Publication Data
US 2018/0040517 A1    Feb. 8, 2018

Related U.S. Application Data

(62) Division of application No. 14/734,538, filed on Jun. 9, 2015, now Pat. No. 9,905,475.

(51) Int. Cl.
*H01L 21/8238* (2006.01)
*H01L 29/66* (2006.01)
(Continued)

(52) U.S. Cl.
CPC ........ *H01L 21/823814* (2013.01); *H01L 21/76224* (2013.01); *H01L 21/823878* (2013.01);
(Continued)

(58) Field of Classification Search
CPC ....... H01L 29/41783; H01L 21/823418; H01L 21/823814; H01L 29/41725; H01L 29/41766
See application file for complete search history.

(56) References Cited

U.S. PATENT DOCUMENTS 5,073,516 A    12/1991   Moslehi
5,451,532 A     9/1995   Bashir et al.
(Continued)

FOREIGN PATENT DOCUMENTS

KR    1020110057853 A    6/2011
TW       200910591 A    3/2009

OTHER PUBLICATIONS

H. Kakiuchi et al., "Formation of Silicon Dioxide Layer at Low Temperatures (150-400° C.) by Atmospheric Pressure Plasma Oxidation of Silicon," Science and Technology of Advanced Materials, Apr. 2007, pp. 137-141, vol. 8, No. 3.
(Continued)

*Primary Examiner* — Herve-Louis Y Assouman
(74) *Attorney, Agent, or Firm* — L. Jeffrey Kelly; Ryan, Mason & Lewis, LLP

(57) ABSTRACT

A method includes isolating a first and at least a second region on a semiconductor substrate, and forming one or more devices on each of the first and at least second regions. Forming the one or more devices includes forming at least one gate structures in each of the first and at least second regions on a first surface of the substrate, depositing a spacer over the gate structures in each of the first and the at least second regions and over the first surface of the substrate, etching horizontal portions of the spacer in the first region, growing epitaxial portions in the first region in alignment with said at least one gate structure in the first region, oxidizing exposed surfaces of the epitaxial portions in the first region, and repeating the etching, growing and oxidizing steps for the at least second region.

20 Claims, 3 Drawing Sheets

(51) Int. Cl.
    *H01L 21/762* (2006.01)
    *H01L 29/417* (2006.01)
    *H01L 27/092* (2006.01)
    *H01L 29/06* (2006.01)

(52) U.S. Cl.
    CPC ........ *H01L 27/092* (2013.01); *H01L 29/0649* (2013.01); *H01L 29/41783* (2013.01); *H01L 29/6653* (2013.01); *H01L 29/66636* (2013.01)

(56) References Cited

U.S. PATENT DOCUMENTS

| | | | |
|---|---|---|---|
| 6,190,976 B1 | 2/2001 | Shishiguchi et al. | |
| 6,316,320 B1 | 11/2001 | Nakahata et al. | |
| 6,686,248 B1 | 2/2004 | Yu | |
| 6,696,334 B1 * | 2/2004 | Hellig | H01L 21/823864 257/E21.64 |
| 8,546,228 B2 | 10/2013 | Doris et al. | |
| 8,853,040 B2 | 10/2014 | Cheng et al. | |
| 8,860,138 B2 | 10/2014 | Doris et al. | |
| 2003/0059995 A1 * | 3/2003 | Hsu | H01L 21/823814 438/199 |
| 2003/0181005 A1 * | 9/2003 | Hachimine | H01L 21/823807 438/231 |
| 2005/0035409 A1 * | 2/2005 | Ko | H01L 21/26506 257/350 |
| 2006/0148151 A1 * | 7/2006 | Murthy | H01L 21/02381 438/197 |
| 2011/0070701 A1 * | 3/2011 | Ning | H01L 21/823807 438/199 |
| 2011/0309446 A1 | 12/2011 | Doris et al. | |
| 2012/0241868 A1 * | 9/2012 | Tsai | H01L 21/823807 257/369 |
| 2013/0330887 A1 | 12/2013 | Cheng et al. | |
| 2014/0248761 A1 | 9/2014 | Park et al. | |
| 2015/0031177 A1 * | 1/2015 | Riley | H01L 21/823807 438/199 |
| 2015/0140768 A1 * | 5/2015 | Yamamoto | H01L 29/66477 438/300 |

OTHER PUBLICATIONS

List of IBM Patents or Patent Applications Treated as Related.

* cited by examiner

100

200

500

600

SELF-ALIGNED HARD MASK FOR EPITAXY PROTECTION

BACKGROUND

Complementary metal-oxide semiconductor (CMOS) is a technology for constructing various types of circuits. CMOS circuits may use a combination of p-type and n-type metal-oxide-semiconductor field-effect transistors (MOSFETs) to implement logic gates and other digital circuits. CMOS technology is used in various applications, including but not limited to microprocessors, microcontrollers, static RAM, etc.

SUMMARY

Embodiments described herein provide semiconductor devices and methods of forming semiconductor devices.

For example, a semiconductor device includes a first and at least a second region isolated on a semiconductor substrate; and one or more devices formed on each of the first and at least second regions. The one or more devices include at least one gate structure formed in each of the first and at least second regions on a first surface of the substrate. The one or more devices further include a spacer deposited over the gate structures in each of the first and the at least second regions and over the first surface of the substrate. The one or more devices further include horizontal portions of the spacer etched in the first region. The one or more devices further include epitaxial portions in the first region grown in alignment with said at least one gate structure in the first region. The one or more devices further include an oxide film on the epitaxial portions in the first region.

Another exemplary embodiment includes a method includes isolating a first and at least a second region on a semiconductor substrate, and forming one or more devices on each of the first and at least second regions. Forming at least one gate structures in each of the first and at least second regions on a first surface of the substrate, depositing a spacer over the gate structures in each of the first and the at least second regions and over the first surface of the substrate, etching horizontal portions of the spacer in the first region, growing epitaxial portions in the first region in alignment with said at least one gate structure in the first region, oxidizing exposed surfaces of the epitaxial portions in the first region, and repeating the etching, growing and oxidizing steps for the at least second region.

These and other features, objects and advantages of the present invention will become apparent from the following detailed description of illustrative embodiments thereof, which is to be read in connection with the accompanying drawings.

DETAILED DESCRIPTION

The present application relates to the field of semiconductor devices and semiconductor device manufacturing and, more particularly, to forming a plurality of field-effect transistors (FETs) using one spacer deposition.

Illustrative embodiments will be described herein with reference to particular methods and apparatus. It is to be appreciated, however, that the invention is not limited to the specific methods and apparatus illustratively shown and described herein. Rather, embodiments of the invention are directed more broadly to techniques for generating FETs on a substrate using a single spacer deposition. Moreover, it will become apparent to those skilled in the art given the teachings herein that numerous modifications can be made to the embodiments shown that are within the scope of the present invention. That is, no limitations with respect to the specific embodiments described herein are intended or should be inferred. For example, the figures show planar MOSFET devices, but the invention can also be applied to other MOSFET such as FINFET, Nanowire, or bipolar junction devices (BJT).

Modern CMOS processes require multiple epitaxy steps for each of the various different types of devices formed such as N-channel FETs (NFETs), P-channel FETs (PFETs), low leakage devices such as embedded dynamic random-access memory (eDRAM), analog devices, etc. Formation of such devices, however, can be complicated and impractical. For example, the different devices may utilize different types of epi, requiring first depositing a spacer followed by an etch process for each of the different types of epi. Such techniques, however, suffer from various disadvantages. For example, such techniques introduce multiple spacer thicknesses and/or widths. In addition, each spacer deposition and etch procedure erodes the shallow trench insulation (STI) regions as well as the gate hard mask and device layers. As such, these methods are complicated and impractical.

Embodiments provide a process for creating self-aligned post epi hard mask in order to do multiple epi with a single spacer deposition, thus creating a self-aligned post epi hard mask such that multiple types of epi can be grown utilizing a single spacer deposition and one etch process per device. Embodiments provide for a semiconductor structure comprising multiple FETs on a substrate formed with a single spacer deposition and a method of making thereof.

An illustrative embodiment for forming multiple FETs on a substrate using a single spacer deposition will be described below with reference to FIGS. 1-6. Each of the structures 100 to 600 illustrate steps which may be used in the process of forming multiple FETs on a substrate using only a single spacer deposition.

Figure 1:
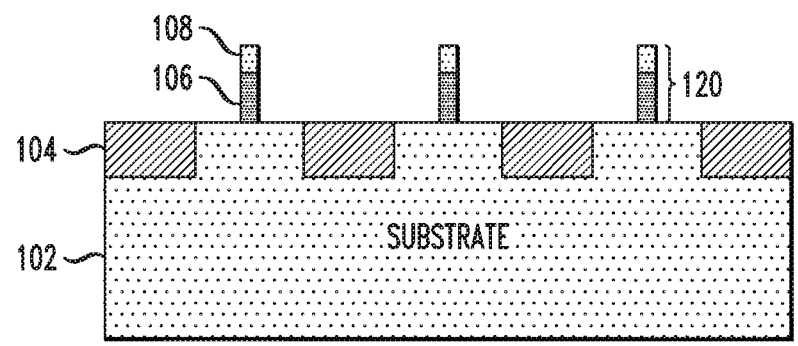
FIG. 1 illustrates a side view of a silicon substrate having multiple gates formed thereon, a gate hard mask formed on each gate, and the gates separated from each other by STI embedded in the substrate, according to an embodiment of the invention.

FIG. 1 is a side view, illustrating formation of the semiconductor structure 100, which includes a substrate 102, shallow trench isolation (STI) regions 104, and a plurality of gate structures 120, each gate structure 120 comprising a gate 106 and a gate hard mask (HM) 108 deposited thereon. The gate HM 108 may be formed from oxide, nitride or any suitable material. Suitable STI insulators may be, for example, one or more dielectric materials such as silicon dioxide, silicon boron nitride, silicon nitride or other insulator.

Figure 2:
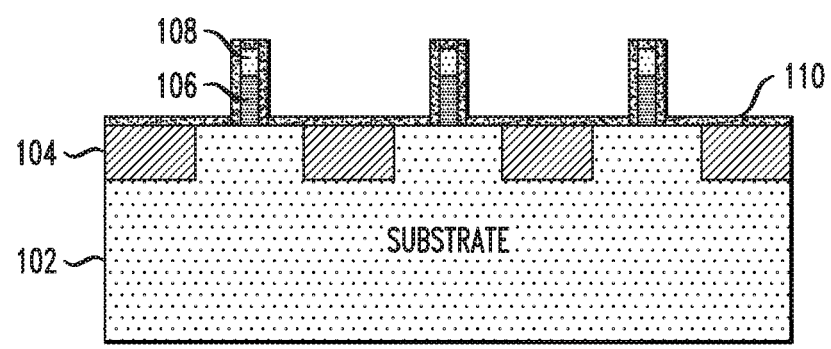
FIG. 2 illustrates a side view of the structure of FIG. 1 after a spacer is deposited over the gate and hard mask structures, and over the surface of the silicon substrate and STIs, according to an embodiment of the invention.

FIG. 2 depicts a side view of the next step in forming the semiconductor device. As shown, a spacer 110 is deposited over the gate structures 120, the surface of substrate 102 and the surface of the STIs 104 in the regions where the plurality of FETs are to be formed, resulting in structure 200. Spacer 110 may be of any suitable thickness, for example, ranging from 5 nm-20 nm. The spacer 110 may be formed from suitable materials, such as, nitride or oxide.

Figure 3:
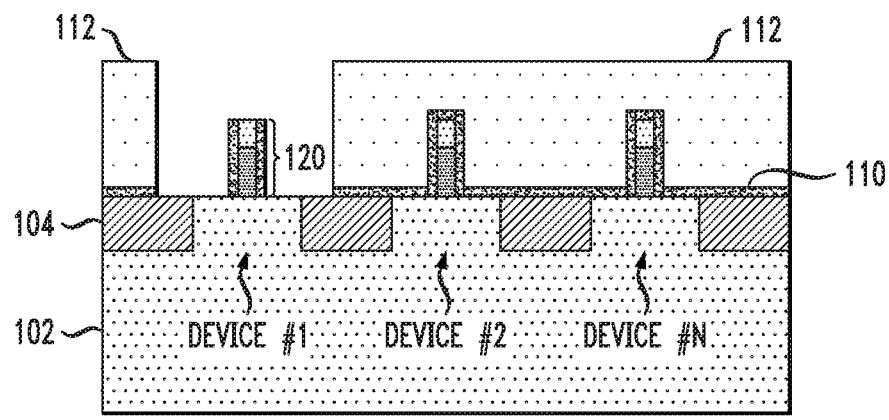
FIG. 3 illustrates a side view of the device of FIG. 2 after patterning a resist mask and etching the spacer in a first device region, according to an embodiment of the invention.

As shown in FIG. 3, which depicts a side view of structure 300, a resist mask 112 is patterned for the first device (device #1). The region of device #1 is etched using, for example, a reactive ion etch (RIE) which removes the horizontally disposed portions of spacer material 110 on the top of the gate structure 120 and from the surface of the substrate 102 and STI 104, leaving vertical sidewall spacers adjacent the gate structure 120. While FIG. 3 shows one device being etched in a first region, it is to be understood that more than one device may be etched in one or more regions such that one RIE is performed for each type of devices (e.g., one RIE for p-type devices, and/or one RIE for n-type devices). Advantageously, only one spacer deposition is required for the structure as a whole, and only one RIE is required for each type of device in the structure.

In the following step, as shown in the side view of structure 400 in FIG. 4, the resist mask is removed and epi 116 is grown in and above substrate 102 between each side of gate structure 120 and STI regions 104, thereby forming source/drain regions for device #1.

Figure 5:
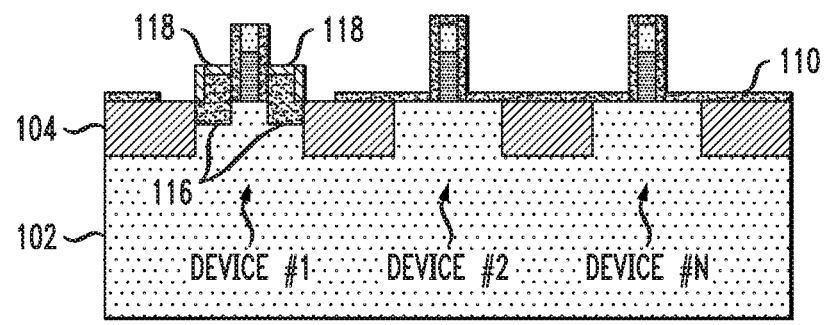
FIG. 5 illustrates a side view of the device of FIG. 4 after an oxide film is grown on the epi surface in the first device region, according to an embodiment of the invention.
Figure 6:
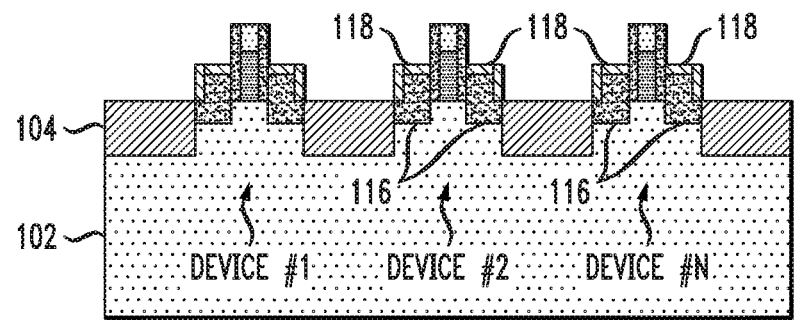
FIG. 6 illustrates a side view of the device of FIG. 5 after repeating the steps of FIGS. 3-5 for each of the remaining device region 2 to region N, according to an embodiment of the invention.

In the next step, as shown in the side view of structure 500 in FIG. 5, a HM 118 is formed by growing an oxide film on the surface of epi 116 to prevent further epi growth when growing epi for devices 2 to N. The oxidized HM 118 is formed for example, using a low temperature plasma oxidation process which helps prevent damage to epi 116. The HM 118 may be formed by oxidizing material 116 in an oxygen ambient or by nitridizing in a nitrogen containing ambient.

Figure 4:
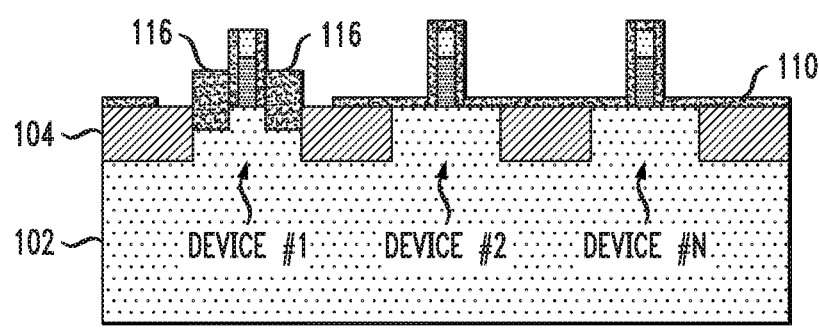
FIG. 4 illustrates a side view of the device of FIG. 3 after removal of the resist mask, and growing epi for the source/drain in the first device region, according to an embodiment of the invention.

Subsequently, the processing steps shown in FIGS. 3-5 are repeated to form device #2 through device # N. An illustrative embodiment is shown in the side view of structure 600 in FIG. 6, structure 600 comprising device #1, device #2 and Device # N formed according to the process detailed in FIGS. 3-5 above. By way of example, the structure 600 shows devices 1, 2 and N of different types. Device #1 may be, by way of example, a PFET device while device #2 is an NFET device and device # N is an eDRAM device. In addition, as discussed above, more than one device of a given type may be formed. As an example, device #1 and device # N may be PFET devices while device #2 may be an NFET device. The epi material for the eDRAM may be different from that of the NFET device and PFET device (e.g., different dopant). Various other types of devices and numbers of devices may be formed.

The process described above in the context of FIGS. 1-6 may also be used for fin devices, silicon on insulator (SOI) devices and bulk devices. For example, to form a fin device according to an embodiment of the invention, the epitaxy may be grown around the fin device.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be appreciated and should be understood that the exemplary embodiments of the invention described above can be implemented in a number of different fashions. Given the teachings of the invention provided herein, one of ordinary skill in the related art will be able to contemplate other implementations of the invention. Although illustrative embodiments of the present invention have been described herein with reference to the accompanying drawings, it is to be understood that the invention is not limited to those precise embodiments, and that various other changes and modifications may be made by one skilled in art without departing from the scope or spirit of the invention.

The invention claimed is:

1. A semiconductor device, comprising:
   a first region, a second region and at least a third region isolated on a semiconductor substrate; and
   one or more devices formed on each of the first region, the second region and the at least third region, the one or more devices comprising:
   at least one gate structure in each of the first region, the second region and the at least third region on a top surface of the substrate;
   a vertical spacer disposed on sidewalls of the at least one gate structure in each of the first region, the second region and the at least third region;
   epitaxial portions disposed in a portion of the substrate and above the top surface of the substrate in the first region, wherein the epitaxial portions above the top surface of the substrate are in contact with a first portion of the vertical spacer disposed on the sidewalls of the at least one gate structure in the first region;
   a first oxide film in contact with the epitaxial portions in the first region, wherein a second portion of the vertical spacer is exposed on the sidewalls and up to a top surface of the at least one gate structure;
   epitaxial portions disposed in a portion of the substrate and above the top surface of the substrate in the second region, wherein the epitaxial portions above the top surface of the substrate are in contact with a first portion of the vertical spacer disposed on the sidewalls of the at least one gate structure in the second region;
   a second oxide film in contact with the epitaxial portions in the second region, wherein a second portion of the vertical spacer is exposed on the sidewalls and up to a top surface of the at least one gate structure;
   epitaxial portions disposed in a portion of the substrate and above the top surface of the substrate in the third region, wherein the epitaxial portions above the top surface of the substrate are in contact with a first portion of the vertical spacer disposed on the sidewalls of the at least one gate structure in the third region; and a third oxide film in contact with the epitaxial portions in the third region, wherein a second portion of the vertical spacer is exposed on the sidewalls and up to a top surface of the at least one gate structure;

wherein at least one of the epitaxial portions in the first region, the second region and the third region comprises a different type of epitaxial material;

wherein at least one of the one or more devices formed on each of the first region, the second region and the at least third region is a different device.

2. The semiconductor device of claim 1, wherein the spacer comprises a thickness ranging from 5 nm to 20 nm.

3. The semiconductor device of claim 1, wherein the spacer comprises one of an oxide and a nitride.

4. The semiconductor device of claim 1, wherein the at least one gate structure comprises a hard mask disposed thereon.

5. The semiconductor device of claim 4, wherein the hard mask comprises one of an oxide and a nitride.

6. The semiconductor device of claim 1, wherein the epitaxial portions in the first region, the second region and the third region form one or more source/drain regions of the device.

7. The semiconductor device of claim 6, wherein the epitaxial portions in the first region comprise an n-doped epi and the epitaxial portions in the second region comprise a p-doped epi.

8. The semiconductor device of claim 1, wherein the epitaxial portions in the first region comprise a p-doped epi and the epitaxial portions in the second region comprise an n-doped epi.

9. The semiconductor device of claim 1, wherein the one or more devices formed on each of the first region, the second region and the at least third region comprise one of PFET, NFET and eDRAM devices.

10. The semiconductor device of claim 1, further comprising one or more shallow trench isolation (STI) regions.

11. An integrated circuit, comprising:
one or more semiconductor devices, wherein each of the one or more semiconductor devices comprise:
a first region, a second region and at least a third region isolated on a semiconductor substrate; and
one or more devices formed on each of the first region, the second region and the at least third region, the one or more devices comprising:
at least one gate structure in each of the first region, the second region and the at least third region on a top surface of the substrate;
a vertical spacer disposed on sidewalls of the at least one gate structure in each of the first region, the second region and the at least third region;
epitaxial portions disposed in a portion of the substrate and above the top surface of the substrate in the first region, wherein the epitaxial portions above the top surface of the substrate are in contact with a first portion of the vertical spacer disposed on the sidewalls of the at least one gate structure in the first region;

a first oxide film in contact with the epitaxial portions in the first region, wherein a second portion of the vertical spacer is exposed on the sidewalls and up to a top surface of the at least one gate structure;

epitaxial portions disposed in a portion of the substrate and above the top surface of the substrate in the second region, wherein the epitaxial portions above the top surface of the substrate are in contact with a first portion of the vertical spacer disposed on the sidewalls of the at least one gate structure in the second region;

a second oxide film in contact with the epitaxial portions in the second region, wherein a second portion of the vertical spacer is exposed on the sidewalls and up to a top surface of the at least one gate structures;

epitaxial portions disposed in a portion of the substrate and above the top surface of the substrate in the third region, wherein the epitaxial portions above the top surface of the substrate are in contact with a first portion of the vertical spacer disposed on the sidewalls of the at least one gate structure in the third region; and a third oxide film in contact with the epitaxial portions in the third region, wherein a second portion of the vertical spacer is exposed on the sidewalls and up to a top surface of the at least one gate structure;

wherein at least one of the epitaxial portions in the first region, the second region and the third region comprises a different type of epitaxial material;

wherein at least one of the one or more devices formed on each of the first region, the second region and the at least third region is a different device.

12. The integrated circuit of claim 11, wherein the spacer comprises a thickness ranging from 5 nm to 20 nm.

13. The integrated circuit of claim 11, wherein the spacer comprises one of an oxide and a nitride.

14. The integrated circuit of claim 11, wherein the at least one gate structure comprises a hard mask disposed thereon.

15. The integrated circuit of claim 14, wherein the hard mask comprises one of an oxide and a nitride.

16. The integrated circuit of claim 11, wherein the epitaxial portions in the first region, the second region and the third region form one or more source/drain regions of the device.

17. The integrated circuit of claim 16, wherein the epitaxial portions in the first region comprise an n-doped epi and the epitaxial portions in the second region comprise a p-doped epi.

18. The integrated circuit of claim 17, wherein the epitaxial portions in the first region comprise a p-doped epi and the epitaxial portions in the second region comprise an n-doped epi.

19. The integrated circuit of claim 11, wherein the one or more devices formed on each of the first region, the second region and the at least third region comprise one of PFET, NFET and eDRAM devices.

20. The integrated circuit of claim 11, wherein the semiconductor device further comprises one or more STI regions.

* * * * *